United States Patent
Brown et al.

(10) Patent No.: US 6,822,522 B1
(45) Date of Patent: Nov. 23, 2004

(54) METHOD AND APPARATUS FOR AN IMPROVED NONLINEAR OSCILLATOR

(75) Inventors: Edgar A. Brown, Decatur, GA (US); Joseph D. Neff, San Diego, CA (US); Steve P. DeWeerth, Marietta, GA (US); Paul Hasler, Atlanta, GA (US); Brian Keith Meadows, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 35 days.

(21) Appl. No.: 10/446,286

(22) Filed: May 23, 2003

(51) Int. Cl.[7] ................................................ H03B 5/20
(52) U.S. Cl. ...................................... 331/135; 330/295
(58) Field of Search .......................... 331/135; 330/69, 330/85, 253, 257, 295

(56) References Cited

U.S. PATENT DOCUMENTS

| | | | | |
|---|---|---|---|---|
| 5,581,215 A | * | 12/1996 | Ogasawara | 331/45 |
| 5,852,385 A | * | 12/1998 | Izumikawa | 331/57 |
| 5,880,634 A | * | 3/1999 | Babanezhad | 330/126 |
| 6,137,370 A | * | 10/2000 | Yamamoto | 331/57 |
| 6,232,840 B1 | * | 5/2001 | Teeter et al. | 330/295 |

OTHER PUBLICATIONS

Brian K. Meadows etal., "Nonlinear Antenna Technology", Proceedings of the IEEE, May 2002, pp. 882–897, vol. 90, No. 5, IEEE, USA.

Joseph D. Neff et al., "A CMOS Coupled Nonlinear Oscillator Array", IEEE International Symposium, May 29, 2002, pp. IV–301–IV–304, vol. 4, USA.

* cited by examiner

*Primary Examiner*—Robert Pascal
*Assistant Examiner*—Joseph Chang
(74) *Attorney, Agent, or Firm*—Allan Y. Lee; Michael A. Kagan; Peter A. Lipovsky

(57) ABSTRACT

A nonlinear oscillator method and apparatus. According to one embodiment, a nonlinear oscillator is closed. The nonlinear oscillator includes a first linear amplifier, a second linear amplifier and nonlinear amplifier having a substantially similar design that includes an adjustable linear transconductance region width. The input/output characteristics of the nonlinear oscillator can be represented by van der Pol equations. In another embodiment, a method for providing nonlinear oscillations is disclosed.

20 Claims, 3 Drawing Sheets

100

Ill
METHOD AND APPARATUS FOR AN IMPROVED NONLINEAR OSCILLATOR

CROSS-REFERENCE TO RELATED APPLICATIONS

This application is related to U.S. Pat. Application Ser. No. 10/446,287, filed May 23, 2003, entitled "Nonlinear Beam Forming and Shaping Aperture System", by Brian K. Meadows et al., Navy Case No. 83793, which is hereby incorporated by reference in its entirety herein for its teachings on oscillator and antenna methods and apparatus.

BACKGROUND OF THE INVENTION

The present invention is generally in the field of oscillators. More specifically, the invention is in the field of non-linear oscillators.

Virtually all modem electronic devices implement oscillators to provide various functions such as clock signals and frequency generation. Many oscillator designs are well known in the art such as Hartley, Colpitts and Wien bridge. Nonlinear oscillators provide sinusoidal (i.e., harmonic) behavior, which can be represented by a set of simple equations as a dynamic system.

A class of nonlinear oscillators known as "van der Pol oscillators" can provide sinusoidal behavior when operated in a weak nonlinear mode. Regardless of design, van der Pol oscillators have two dynamical variables and comprise nonlinear response (NLR) devices and linear response (LR) devices. Typical van der Pol oscillators include weak NLR (WNLR) devices that produce weak nonlinear responses from "OpAmps" (i.e., operational amplifiers) coupled with additional circuit elements such as resistors and diodes. In addition, typical van der Pol oscillators are designed without uniformity of amplifiers. For example, typical van der Pol WNLR devices include different amplifiers than typical van der Pol LR devices.

Disadvantageously, typical van der Pol oscillators comprise many different circuit elements such as amplifiers, resistors and diodes. Additionally, some circuit elements, such as amplifiers, are non-uniform. Thus, implementation in device processes (e.g., CMOS device processes) can be complex and costly. Moreover, typical van der Pol WNLR devices disadvantageously consume large chip areas when implemented in microchip devices (e.g., CMOS devices) because OpAmps are coupled with additional circuits to produce nonlinear responses.

Therefore, a need exists for an improved nonlinear amplifier having reduced complexity, which reduces fabrication cost. In addition, a need exists for a method and apparatus for a nonlinear amplifier that reduces consumption of chip area.

SUMMARY OF THE INVENTION

The present invention is directed to a method and apparatus for a nonlinear oscillator. The invention overcomes the need in the art for a nonlinear oscillator having reduced complexity and reduced consumption of chip area, which reduces fabrication cost. The present invention includes multiple amplifiers having a substantially similar design, which can produce weak nonlinear response functions and linear response functions. The present inventive nonlinear oscillator can use a single amplifier design to produce nonlinear responses.

According to one embodiment, the present invention is a nonlinear oscillator, where the system includes a first linear amplifier, a second linear amplifier and a nonlinear amplifier, which have a substantially similar design that includes an adjustable linear transconductance region width. The first linear amplifier receives an input voltage and outputs a first output current. The second linear amplifier is operatively coupled to the first linear amplifier. The second linear amplifier receives the first output current and outputs a second output current. The nonlinear amplifier is operatively coupled to the first and second linear amplifiers. The nonlinear amplifier receives the second output current and outputs a third output current. The input/output characteristics of the nonlinear oscillator can be represented by the van der Pol equations. In one embodiment, the nonlinear oscillator further comprises a first capacitor and a second capacitor. The first capacitor is operatively coupled to an output of the first linear amplifier, an input of the second linear amplifier, an input of the first linear amplifier and an output of the nonlinear amplifier. The second capacitor is operatively coupled to an output of the second linear amplifier, an input of the second linear amplifier and an input of the nonlinear amplifier.

According to another embodiment, the present invention is a method for providing nonlinear oscillations in a nonlinear oscillator. The method comprises a step of receiving an input voltage and a first oscillator voltage in a first linear amplifier. Next, a first difference voltage is converted to a first linearly proportional current via the first linear amplifier. Then, a first capacitor is charged via output currents from the first linear amplifier and a nonlinear amplifier. Thereafter, a second oscillator voltage and the first oscillator voltage are received in a second linear amplifier. Next, a second difference voltage is converted to a second linearly proportional current via the second linear amplifier. Then, a second capacitor is charged via the second linearly proportional current. Thereafter, the second oscillator voltage and the first oscillator voltage are received in the nonlinear amplifier. Next, a third difference voltage is converted to a nonlinearly proportional current via the nonlinear amplifier. The method then returns to the first step. The input/output characteristics of the nonlinear oscillator can be represented by the van der Pol equations. The first linear amplifier, second linear amplifier and nonlinear amplifier have a substantially similar design that includes an adjustable linear transconductance region width.

The previously summarized features and advantages along with other aspects of the present invention will become clearer upon review of the following specification taken together with the included drawings.

DETAILED DESCRIPTION OF THE INVENTION

The present invention is directed to a method and apparatus for an improved nonlinear oscillator. Although the invention is described with respect to specific embodiments, the principles of the invention, as defined by the claims appended herein, can obviously be applied beyond the specifically described embodiments of the invention described herein. Moreover, in the description of the present invention, certain details have been left out in order to not obscure the inventive aspects of the invention. The details left out are within the knowledge of a person of ordinary skill in the art.

The drawings in the present application and their accompanying detailed description are directed to merely exemplary embodiments of the invention. To maintain brevity, other embodiments of the invention that use the principles of the present invention are not specifically described in the present application and are not specifically illustrated by the present drawings.

The present inventive nonlinear oscillator method and apparatus includes multiple amplifiers having a substantially similar design, which can produce nonlinear response functions and linear response functions. The present inventive nonlinear oscillator can use a single amplifier design to produce nonlinear responses. The method and apparatus advantageously reduces complexity of nonlinear oscillators, which improves implementation and reduces chip area consumption and fabrication cost.

Figure 1:
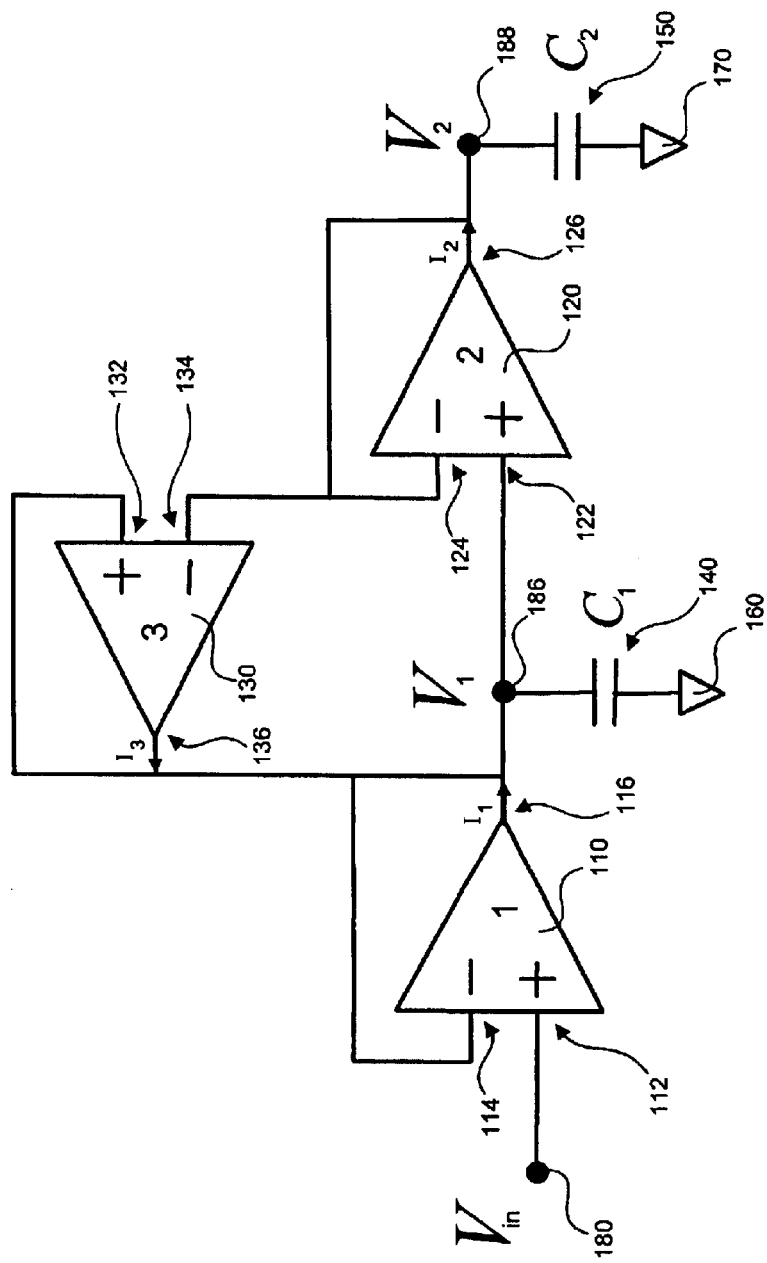
FIG. 1 is a block diagram representing an improved nonlinear oscillator according to one embodiment of the present invention.

FIG. 1 is a block diagram representing an improved nonlinear oscillator according to one embodiment of the present invention. As shown in FIG. 1, nonlinear oscillator 100 includes first linear amplifier 110, second linear amplifier 120, nonlinear amplifier 130, first capacitor 140 and second capacitor 150. First linear amplifier 110 includes inputs 112 and 114 and output 116. Input 112 is electrically coupled to input node 180. Input 114 is electrically coupled to output 116. Output 116 is electrically coupled to a first terminal of first capacitor 140. A second terminal of first capacitor 140 is electrically coupled to ground 160.

Second linear amplifier 120 includes inputs 122 and 124 and output 126. Input 122 is electrically coupled to output 116 and the first terminal of first capacitor 140. Input 124 is electrically coupled to output 126. Output 126 is electrically coupled to a first terminal of second capacitor 150. A second terminal of second capacitor 150 is electrically coupled to ground 170.

Nonlinear amplifier 130 includes inputs 132 and 134 and output 136. Input 132 is electrically coupled to output 136, input 114, output 116, the first terminal of first capacitor 140 and input 122. Input 134 is electrically coupled to input 124, output 126 and the first terminal of second capacitor 150.

As shown in FIG. 1, input 112 of first linear amplifier 110 receives an input voltage ($V_{in}$) from input node 180. Input 114 of first linear amplifier 10 receives a feedback signal. Output 116 produces a first output current ($I_1$). Input 122 of second linear amplifier 120 receives a voltage ($V_1$) and input 124 of second linear amplifier 120 receives a feedback signal. Output 126 produces a second output current ($I_2$). Input 134 of nonlinear amplifier 130 receives a voltage ($V_2$) and input 132 of second linear amplifier 130 receives a feedback signal. Output 136 produces a third output current ($I_3$). Voltages $V_1$ and $V_2$ are output by output nodes 186 and 188, respectively. Nonlinear oscillator 100 operates to produce nonlinear oscillations according to the well-known van der Pol equations as described in detail hereinbelow.

In one embodiment and according to the invention, first linear amplifier 110, second linear amplifier 120 and nonlinear amplifier 130 have substantially similar designs. In one embodiment, first linear amplifier 110, second linear amplifier 120 and nonlinear amplifier 130 have identical designs. These amplifiers feature linear transconductance region widths, which can be adjusted via amplifier parameters to provide nonlinear properties. Thus, nonlinear amplifier 130 provides nonlinear properties when amplifier parameters are adjusted to limit the linear transconductance region width. First linear amplifier 110 and second linear amplifier 120 provide linear properties when amplifier parameters are adjusted to increase the linear transconductance region width (i.e., have a wide linear transconductance region width). An exemplary amplifier that can be used to implement first linear amplifier 110, second linear amplifier 120 and nonlinear amplifier 130 of the present inventive nonlinear oscillator is now described.

Figure 2:
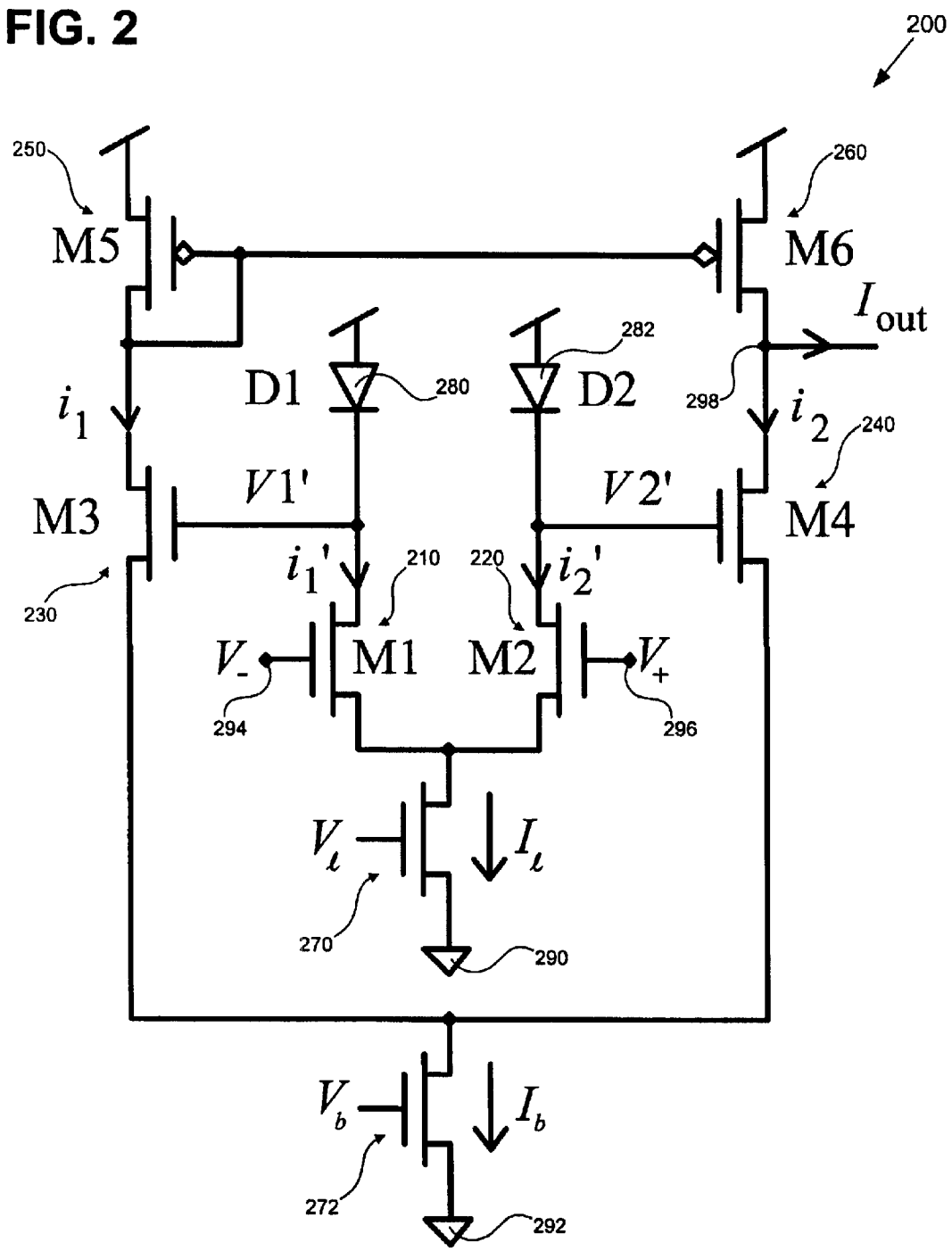
FIG. 2 is a schematic diagram of one embodiment of an amplifier in accordance with the present invention.

FIG. 2 is a schematic diagram of one embodiment of an amplifier in accordance with the present invention. Those skilled in the art shall recognize that different amplifier designs having adjustable linear transconductance region widths can be used with the present invention without departing from the scope or spirit of the present invention. As shown in FIG. 2, amplifier 200 includes transistors 210, 220, 230, 240, 250, 260, 270 and 272 and diodes 280 and 282.

Transistor 210 includes a source, a gate and a drain. The gate of transistor 210 is electrically coupled to input node 294. The drain of transistor 210 is electrically coupled to transistor 220 and transistor 270. The source of transistor 210 is electrically coupled to transistor 230 and a terminal of diode 280.

Transistor 220 includes a source, a gate and a drain. The gate of transistor 220 is electrically coupled to input node 296. The drain of transistor 220 is electrically coupled to transistor 270 and the drain of transistor 220. The source of transistor 220 is electrically coupled to transistor 240 and a terminal of diode 282.

Transistor 230 includes a source, a gate and a drain. The gate of transistor 230 is electrically coupled to a terminal of diode 280 and the source of transistor 210. The drain of transistor 230 is electrically coupled to transistor 272 and transistor 240. The source of transistor 230 is electrically coupled to transistor 250 and transistor 260.

Transistor 240 includes a source, a gate and a drain. The gate of transistor 240 is electrically coupled to a terminal of diode 282 and the source of transistor 220. The drain of transistor 230 is electrically coupled to transistor 272 and the drain of transistor 230. The source of transistor 230 is electrically coupled to transistor 260 and output node 298.

Transistor 250 includes a source, a gate and a drain. The gate of transistor 240 is electrically coupled to transistor 260, the drain of transistor 250 and the source of transistor 230. The drain of transistor 250 is electrically coupled to the source of transistor 230.

Transistor 260 includes a source, a gate and a drain. The gate of transistor 260 is electrically coupled to the source of transistor 230 and the gate and the drain of transistor 250. The drain of transistor 260 is electrically coupled to the source of transistor 240 and output node 298.

Transistor 270 includes a source, a gate and a drain. The drain of transistor 270 is electrically coupled to ground 290. The source of transistor 270 is electrically coupled to the drain of transistor 210 and the drain of transistor 220. The gate of transistor 270 receives a voltage ($V_L$).

Transistor 272 includes a source, a gate and a drain. The drain of transistor 272 is electrically coupled to ground 292. The source of transistor 272 is electrically coupled to the drain of transistor 230 and the drain of transistor 240. The gate of transistor 272 receives a voltage ($V_b$).

As shown in FIG. 2, the gate of transistor 210 receives an input voltage ($V_-$) from input node 294. The gate of transistor 220 receives an input voltage (V$_+$) from input node 296. The drain of transistor 260 produces an output current (I$_{out}$) to output node 298. Transistors 210 and 220 form a below-threshold differential pair. Transistors 230 and 240 form an above-threshold differential pair having currents that are renormalized by diodes 280 and 282 and the below-threshold differential pair (i.e., transistors 210 and 220).

Equations 1–3 (shown below) represent the input/output characteristics of amplifier 200. Equation 1 represents the input/output characteristics of amplifier 200 as defined by the following parameters: A$_n$, B$_n$, V$_+$ and V$_-$. Parameters V$_+$ and V$_-$ are input voltages. Parameters A$_n$ and B$_n$ are defined in Equations 2 and 3, respectively.

$$I_n(V_+, V_-) = B_n \tanh(A_n(V_+ - V_-)) \quad \text{(Equation 1)}$$

where I$_n$ is the amplifier current of the n$^{th}$ amplifier.

$$A_n = \frac{\alpha}{V_{tn} - V_{t0}}; \quad \text{(Equation 2)}$$

where V$_{tn}$ is an adjustable voltage parameter;
V$_{t0}$ is a fixed voltage parameter;
α is a fixed parameter.

$$B_n = I_0 e^{\beta V_{bn}}; \quad \text{(Equation 3)}$$

where I$_0$ is a fixed bias current;
V$_{bn}$ is an adjustable voltage parameter;
β is a fixed parameter.

As described above and according to the present invention, one embodiment of the invention includes amplifiers having identical designs, where first linear amplifier 10, second linear amplifier 120 and nonlinear amplifier 130 (FIG. 1) each comprise amplifier 200 (FIG. 2). Thus, input node 296 (FIG. 2) corresponds to inputs 112, 122 and 132 (FIG. 1); input node 294 (FIG. 2) corresponds to inputs 114, 124 and 134 (FIG. 1); and output node 298 (FIG. 2) corresponds to outputs 116, 126 and 136 (FIG. 1). Those skilled in the art shall recognize that substantially similar amplifiers having similar fabrication complexity can be used to implement the present invention without departing from the scope or spirit of the present invention. Referring again to FIG. 1, nonlinear oscillator 100 has equations of motion that can be represented by Equations 4 and 5. Equations 4 and 5 can be derived from Equations 1–3, amplifier transconductance and Kirchoff's current law.

$$C_1 \dot{V}_1 = I_1(V_{in}, V_1) + I_3(V_1, V_2); \quad \text{(Equation 4)}$$

where C$_1$ is the capacitance of first capacitor 140;
$\dot{V}_1$ is the first derivative of V$_1$ with respect to time;
V$_1$ is a nonlinear oscillator state-variable (voltage);
V$_2$ is a nonlinear oscillator state-variable (voltage);
V$_{in}$ is input voltage of nonlinear oscillator 100;
I$_1$ is the output current of first linear amplifier 110;
I$_3$ is the output current of nonlinear amplifier 130.

$$C_2 \dot{V}_2 = I_2(V_1, V_2); \quad \text{(Equation 5)}$$

where C$_2$ is the capacitance of second capacitor 150;
$\dot{V}_1$ is the first derivative of V$_1$ with respect to time;
V$_1$ is a nonlinear oscillator state-variable (voltage);
V$_2$ is a nonlinear oscillator state-variable (voltage);
I$_2$ is the output current of second linear amplifier 110;

Equations 6–9 (shown below) represent oscillator behavior of nonlinear oscillator 100 (FIG. 1) when first linear amplifier 110, second linear amplifier 120 and nonlinear amplifier 130 (FIG. 1) each comprise amplifier 200 (FIG. 2). Equations 6–9 can be derived from circuit equations of motion by changing variables so that x=V$_2$−V$_1$ and y=V$_2$−V$_{in}$, with y related to x using $\dot{y}=-x$, and by expanding I$_3$ about x to third order. In equations 6–9, A$_2$=A$_1$, B$_2$=B$_1$ and C$_2$=C$_1$. Equation 6 relates to the behavior of nonlinear oscillator 100 to the well-understood van der Pol equations and the more descriptive parameters, μ (which effects nonlinearity), η (which sets the amplitude of oscillation) and ω (which sets the frequency of oscillation). Each of these parameters (i.e., μ nonlinearity, η amplitude and ω frequency) is defined by the less descriptive parameters of A$_1$, A$_2$, A$_3$, B$_1$, B$_2$ and B$_3$, which are set by the accessible parameters of V$_{t1}$, V$_{t2}$, V$_{t3}$, V$_{b1}$, V$_{b2}$ and V$_{b3}$ via Equations 2 and 3.

$$\ddot{x} = 2\mu(1-\eta x^2)\dot{x} - \omega^2 x; \quad \text{(Equation 6)}$$

where x is the van der Pol variable;
$\dot{x}$ is the first derivative of x with respect to time;
$\ddot{x}$ is the second derivative of x with respect to time.

$$\mu = \frac{1}{2C_1}(A_3 B_3 - A_1 B_1); \quad \text{(Equation 7)}$$

where A$_3$ is a parameter that sets the width of the linear transconductance region of nonlinear amplifier 130;
B$_3$ is a parameter that sets the overall gain of nonlinear amplifier 130;
A$_1$ is a parameter that sets the width of the linear transconductance region of linear amplifier 110;
B$_1$ is a parameter that sets the overall gain of linear amplifier 110;
C$_1$ is the capacitance of first capacitor 140.

$$\eta = \frac{A_3^3 B_3}{A_3 B_3 - 2A_1 B_1}; \quad \text{(Equation 8)}$$

where A$_3$ is a parameter that sets the width of the linear transconductance region of nonlinear amplifier 130;
B$_3$ is a parameter that sets the overall gain of nonlinear amplifier 130;
A$_1$ is a parameter that sets the width of the linear transconductance region of linear amplifier 110;
B$_1$ is a parameter that sets the overall gain of linear amplifier 110;

$$\omega = \frac{A_1 B_1}{C_1}; \quad \text{(Equation 9)}$$

where A$_1$ is a parameter that sets the width of the linear transconductance region of linear amplifier 110;
B$_1$ is a parameter that sets the overall gain of linear amplifier 110;
C$_1$ is the capacitance of first capacitor 140.

Figure 3:
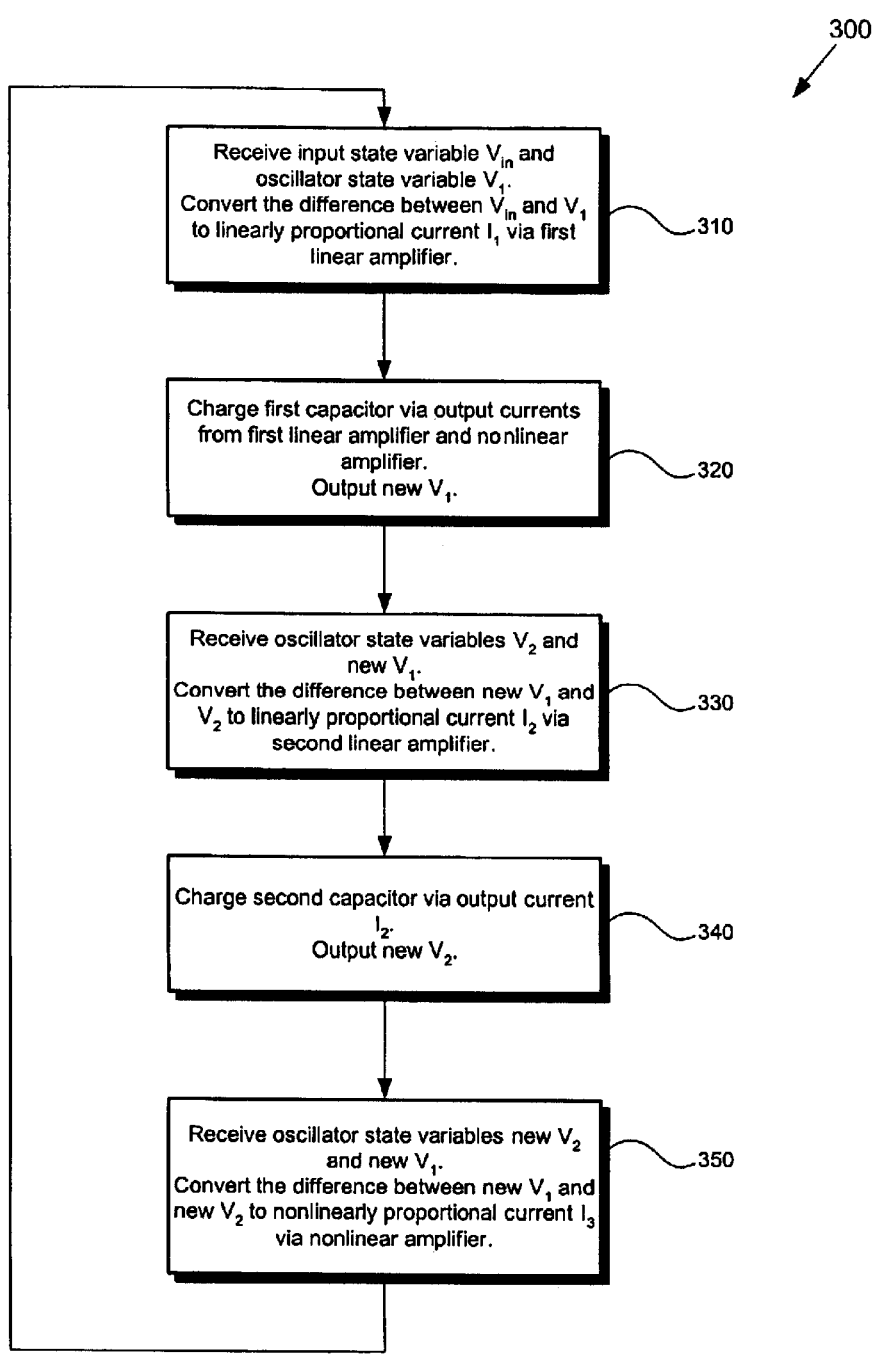
FIG. 3 is a flowchart of an exemplary method to implement the present invention.

FIG. 3 is a flowchart of an exemplary method to implement the present inventive nonlinear oscillator. As shown in FIG. 3, method 300 begins at STEP 310 whereat input state variable V$_{in}$ (voltage) and oscillator state variable V$_1$ (voltage) are received by a first linear amplifier. A first difference voltage (i.e., voltage between V$_{in}$ and V$_1$) is converted to a first linearly proportional current $I_1$ via the first linear amplifier. After STEP 310, the method proceeds to STEP 320 whereat a first capacitor is charged via currents $I_1$ and $I_3$ from the first linear amplifier and a nonlinear amplifier, respectively, which changes $V_1$. New $V_1$ is output. After STEP 320, the method proceeds to STEP 330 whereat oscillator state variables $V_2$ and new $V_1$ (voltages) are received by a second linear amplifier. A second difference voltage (i.e., voltage between new $V_1$ and $V_2$) is converted to a second linearly proportional current $I_2$ via the second linear amplifier. After STEP 330, the method proceeds to STEP 340 whereat a second capacitor is charged via output current $I_2$ from the second linear amplifier, which changes $V_2$. New $V_2$ is output. After STEP 340, the method proceeds to STEP 350 whereat oscillator state variables new $V_2$ and new $V_1$ (voltages) are received by the nonlinear amplifier. A third difference voltage (i.e., voltage between new $V_1$ and new $V_2$) is converted to nonlinearly proportional current $I_3$ via the nonlinear amplifier. After STEP 350, the method returns to STEP 310.

In one embodiment of the method 300 of FIG. 3, the first linear amplifier, second linear amplifier and nonlinear amplifier are substantially similar in design, wherein the nonlinear oscillator behaves according to Equations 6–9. In another embodiment, the first linear amplifier, second linear amplifier and nonlinear amplifier are identical in design, wherein the nonlinear oscillator behaves according to Equations 6–9.

The accessible parameters of $V_{r1}$, $V_{r2}$, $V_{r3}$, $V_{b1}$, $V_{b2}$ and $V_{b3}$ via can be adjusted to provide desired circuit behavior. In one embodiment, one of these parameters is adjusted to provide desired circuit behavior. For example, $V_{r3}$ can be adjusted to provide desired circuit behavior. In one embodiment, at least two of these parameters are adjusted to provide desired circuit behavior. For example, $V_{r1}$, $V_{r2}$ and $V_{r3}$ can be adjusted to provide desired circuit behavior.

The present inventive nonlinear oscillator output $V_1$ and output $V_2$ are voltages that oscillate in a sinusoidal fashion when the nonlinear oscillator operates in a weak nonlinear mode (i.e., $0<\mu<1$). The van der Pol equivalent of the nonlinear oscillator can be represented by $x=V_2-V_1$ (see Equations 6–9). Various modes of operation for a van der Pol oscillator are chiefly determined by the parameters $\mu$ and $\omega$. Oscillatory behavior is obtained with $0<\mu<\omega$. Weak nonlinear (sinusoidal) behavior is obtained with $0<\mu<1$. In practice, according to equation 7, the van der Pol parameter $\mu$ is a function of a number of the accessible parameters (i.e., $\mu=\mu(V_{r1},V_{r3},V_{b1},V_{b3})$). Thus, a trade-space of accessible parameters exists such that several parameters can be concurrently changed without changing the value of $\mu$.

In the van der Pol perspective, the behavior of an oscillator is set by the parameters $\mu$, $\eta$ and $\omega$. In accordance with the present inventive nonlinear oscillator, the parameters $\mu$, $\eta$ and $\omega$ are functions of the accessible parameters $V_{r1}$, $V_{r3}$, $V_{b1}$, $V_{b3}$ (voltages). Advantageously, a trade-space between accessible parameters for a particular van der Pol parameter exists. Thus, certain behavior (e.g., weak nonlinear behavior where $0<\mu<1$) can be achieved flexibly.

From the above description of the invention, it is manifest that various techniques can be used for implementing the concepts of the present invention without departing from its scope. Moreover, while the invention has been described with specific reference to certain embodiments, a person of ordinary skills in the art would recognize that changes can be made in form and detail without departing from the spirit and the scope of the invention. The described embodiments are to be considered in all respects as illustrative and not restrictive. It should also be understood that the invention is not limited to the particular embodiments described herein, but is capable of many rearrangements, modifications, and substitutions without departing from the scope of the invention.

We claim:

1. A nonlinear oscillator comprising:

a) a first linear amplifier, capable of receiving an input voltage ($V_{in}$) and outputting a first output current ($I_1$);

b) a second linear amplifier, operatively coupled to said first linear amplifier, wherein said second linear amplifier is capable of receiving said first output current and outputting a second output current ($I_2$); and c) a nonlinear amplifier, operatively coupled to said first linear amplifier and said second linear amplifier, wherein said nonlinear amplifier is capable of receiving said second output current and outputting a third output current ($I_3$);

wherein said nonlinear oscillator outputs a first oscillator voltage ($V_1$) and a second oscillator voltage ($V_2$), and wherein said first linear amplifier, said second linear amplifier and said nonlinear amplifier have a substantially similar design that includes an adjustable linear transconductance region width, and wherein input/output characteristics of said nonlinear oscillator maintain the following relationship: $\ddot{x}=2\mu(1-\eta x^2)\dot{x}-\omega^2 x$.

2. The nonlinear oscillator of claim 1, wherein said adjustable linear transconductance region of said nonlinear amplifier is adjusted to provide nonlinear properties.

3. The nonlinear oscillator of claim 1, wherein said adjustable linear transconductance region of said first linear amplifier and said second linear amplifier is adjusted to provide linear properties.

4. The nonlinear oscillator of claim 1, wherein said first linear amplifier, said second linear amplifier and said nonlinear amplifier have an identical design.

5. The nonlinear oscillator of claim 1, further comprising:

i) a first capacitive element, operatively coupled to an output of said first linear amplifier, an input of said second linear amplifier, an input of said first linear amplifier, an input of said nonlinear amplifier and an output of said nonlinear amplifier; and ii) a second capacitive element, operatively coupled to an output of said second linear amplifier, an input of said second linear amplifier and an input of said nonlinear amplifier.

6. The nonlinear oscillator of claim 1, further comprising:

i) a first capacitor having a first terminal operatively coupled to said first linear amplifier, said second linear amplifier and said nonlinear amplifier and a second terminal operatively coupled to ground; and ii) a second capacitor having a first terminal operatively coupled to said second linear amplifier and said nonlinear amplifier and a second terminal operatively coupled to ground.

7. The nonlinear oscillator of claim 1, wherein an output of said first linear amplifier is operatively coupled to an input of said first linear amplifier, an input of said second linear amplifier, an input of said nonlinear amplifier and an output of said nonlinear amplifier, and wherein an output of said second linear amplifier is operatively coupled to an input of said second linear amplifier and an input of said nonlinear amplifier, and wherein an output of said nonlinear amplifier is operatively coupled to an input of said nonlinear amplifier, an input of said first linear amplifier and an input of said second linear amplifier.

8. The nonlinear oscillator of claim 1, wherein said substantially similar design comprises:
  i) an above-threshold differential pair, capable of outputting a current;
  ii) a diode pair, operatively coupled to the below-threshold differential pair; and
  iii) a below-threshold differential pair, operatively coupled to said below-threshold differential pair and said diode pair;
wherein said current is renormalized by said below-threshold differential pair and said diode pair.

9. A nonlinear oscillator comprising:
  a) a first linear amplifier, capable of receiving an input voltage ($V_{in}$) and outputting a first output current ($I_1$), wherein a first input of said first linear amplifier is operatively coupled to an input node, and wherein an output of said first linear amplifier is operatively coupled to a second input of said first linear amplifier;
  b) a second linear amplifier, capable of receiving said first output current and outputting a second output current ($I_2$), wherein a first input of said second linear amplifier is operatively coupled to said output of said first linear amplifier, and wherein an output of said second linear amplifier is operatively coupled to a second input of said second linear amplifier; and
  c) a nonlinear amplifier, capable of receiving said second output current and outputting a third output current ($I_3$), wherein a first input of said nonlinear amplifier is operatively coupled to said second input of said second linear amplifier and said output of said second linear amplifier, and wherein an output of said nonlinear amplifier is operatively coupled to a second input of said nonlinear amplifier, said first input of said second linear amplifier, said output of said first linear amplifier, said second input of said first linear amplifier and an output node;
  wherein said nonlinear oscillator outputs a first oscillator voltage ($V_1$) and a second oscillator voltage ($V_2$), and wherein said first linear amplifier, said second linear amplifier and said nonlinear amplifier have a substantially similar design that includes an adjustable linear transconductance region width, and wherein input/output characteristics of said nonlinear oscillator maintain the following relationship: $\ddot{x}=2\mu(1-\eta x^2)\dot{x}-\omega^2 x$.

10. The nonlinear oscillator of claim 9, wherein said adjustable linear transconductance region of said nonlinear amplifier is adjusted to provide nonlinear properties.

11. The nonlinear oscillator of claim 9, wherein said first linear amplifier, said second linear amplifier and said nonlinear amplifier have an identical design.

12. The nonlinear oscillator of claim 9, further comprising:
  i) a first capacitive element, operatively coupled to said output of said first linear amplifier, said first input of said second linear amplifier, said second input of said first linear amplifier, said second input of said nonlinear amplifier and said output of said nonlinear amplifier; and
  ii) a second capacitive element, operatively coupled to said output of said second linear amplifier, said first input of said nonlinear amplifier and said second input of said second linear amplifier.

13. The nonlinear oscillator of claim 9, further comprising:
  i) a first capacitor having a first terminal operatively coupled to said first linear amplifier, said second linear amplifier and said nonlinear amplifier and a second terminal operatively coupled to ground; and
  ii) a second capacitor having a first terminal operatively coupled to said second linear amplifier and said nonlinear amplifier and a second terminal operatively coupled to ground.

14. A method for providing nonlinear oscillations in a nonlinear oscillator, the method comprising the steps of:
  a) receiving an input voltage ($V_{in}$) and a first oscillator voltage ($V_1$) in a first linear amplifier;
  b) converting a first difference voltage to a first linearly proportional current ($I_1$) via said first linear amplifier;
  c) charging a first capacitor via output currents from said first linear amplifier and a nonlinear amplifier;
  d) receiving a second oscillator voltage ($V_2$) and said first oscillator voltage in a second linear amplifier;
  e) converting a second difference voltage to a second linearly proportional current ($I_2$) via said second linear amplifier;
  f) charging a second capacitor via said second linearly proportional current;
  g) receiving said second oscillator voltage and said first oscillator voltage in said nonlinear amplifier;
  h) converting a third difference voltage to a nonlinearly proportional current ($I_3$) via said nonlinear amplifier;
  i) returning to STEP (a);
  wherein said first linear amplifier, said second linear amplifier and said nonlinear amplifier have a substantially similar design that includes an adjustable linear transconductance region width, and wherein input/output characteristics of said nonlinear oscillator maintain the following relationship: $\ddot{x}=2\mu(1-\eta x^2)\dot{x}-\omega^2 x$.

15. The method of claim 14, wherein said STEP (c) comprises the following sub-steps:
  i) charging a first capacitor via output currents from said first linear amplifier and a nonlinear amplifier;
  ii) outputting said first oscillator voltage.

16. The method of claim 14, wherein said STEP (f) comprises the following sub-steps:
  i) charging a second capacitor via said second linearly proportional current;
  ii) outputting said second oscillator voltage.

17. The method of claim 14, wherein said method is capable of adjusting a set of parameters comprising linearity, amplitude and frequency to provide desired circuit behavior.

18. The method of claim 17, wherein said method adjusts one of said set of parameters to provide desired circuit behavior.

19. The method of claim 17, wherein said method adjusts at least two of said set of parameters to provide desired circuit behavior.

20. The method of claim 17, wherein said method maintains the relationship $0<\mu<1$ to operate in a weak nonlinear mode.

* * * * *